(12) United States Patent
Kremer et al.

(10) Patent No.: US 7,362,413 B2
(45) Date of Patent: Apr. 22, 2008

(54) UNIFORMITY CORRECTION FOR LITHOGRAPHIC APPARATUS

(75) Inventors: Alexander Kremer, Stamford, CT (US); Marcel Mathijs Theodore Marie Dierichs, Venlo (NL); Erik Roelof Loopstra, Heeze (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 229 days.

(21) Appl. No.: 11/007,580

(22) Filed: Dec. 9, 2004

(65) Prior Publication Data

US 2006/0126036 A1 Jun. 15, 2006

(51) Int. Cl.
*G03B 27/52* (2006.01)
*G03B 27/54* (2006.01)
*G21F 1/00* (2006.01)
(52) U.S. Cl. .................. 355/30; 355/67; 250/515.1
(58) Field of Classification Search ............ 355/53, 355/67, 30, 71, 74–75; 250/515.1, 519.1
See application file for complete search history.

(56) References Cited

U.S. PATENT DOCUMENTS

| | | | | |
|---|---|---|---|---|
| 5,966,202 A | * | 10/1999 | McCullough | 355/67 |
| 6,097,474 A | | 8/2000 | McCullough et al. | 355/69 |
| 6,445,439 B1 | * | 9/2002 | McCullough | 355/30 |
| 6,633,364 B2 | * | 10/2003 | Hayashi | 355/53 |
| 2003/0002021 A1 | * | 1/2003 | Sato | 355/67 |
| 2003/0202165 A1 | * | 10/2003 | Shiraishi | 355/67 |
| 2004/0051858 A1 | * | 3/2004 | Mulkens et al. | 355/67 |
| 2005/0140957 A1 | * | 6/2005 | Luijkx et al. | 355/71 |

* cited by examiner

*Primary Examiner*—Peter B. Kim
(74) *Attorney, Agent, or Firm*—Pillsbury Winthrop Shaw Pittman, LLP

(57) ABSTRACT

A uniformity correction module for improving the uniformity of a radiation distribution in a rectangular illumination slit having two longer sides and two shorter sides, including a plurality of movable blades arranged along each long side of the illumination slit and a chamber containing a fluid wherein said movable blades are at least partly immersed in said fluid, and wherein the difference between the refractive index of each blade and the refractive index of said fluid is sufficiently small to prevent significant reflection and refraction at the surface of each blade.

32 Claims, 7 Drawing Sheets

Smear area

UNIFORMITY CORRECTION FOR LITHOGRAPHIC APPARATUS

BACKGROUND OF THE INVENTION

1. Field of the Invention

The present invention relates to uniformity correction modules, lithographic apparatus comprising a uniformity correction module, a method of increasing the uniformity of an illumination beam, and a device manufacturing method using a uniformity correction module.

2. Background of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

The invention relates to uniformity correction modules (sometimes referred to as "unicoms") that consist of a plurality of light-absorbing elements the positions of which are adjustable in the scanning direction in order to set the outer boundary of the illumination slit. Such a unicom (sometimes also called dynamic adjustable slit or "DYAS") is described in U.S. Pat. No. 6,097,474. The elements may for example be embodied as transmissive quartz plates which are coated with a semi-transparent layer. A disadvantage of these plates is that refraction occurs at the air-quartz interface at the edges leading to ellipticity, telecentricity, local straylight or hotspot errors.

Current uniformity correction modules function in air or vacuum i.e. in an ambient with a refractive index n=1. For the coming generation high numerical aperture (NA) systems (NA>0.5) no feasible solution exists to use a known concept that does not affect the pupil and telecentricity distribution negatively. The pupil distribution is the intensity distribution in the pupil plane of the projection system, and corresponds with the angular intensity distribution of the projection beam. The telecentricity of a radiation beam impinging on a point on a wafer is the average incident angle. Preferably the telecentricity is perpendicular to the wafer surface but in practice it shows a slight variation over the illuminated field/slit.

SUMMARY OF THE INVENTION

In accordance with a first aspect of the invention there is provided a uniformity correction module for improving the uniformity of a radiation distribution in a rectangular illumination slit having two long sides and two short sides, including a plurality of movable blades arranged along each long side of the illumination slit, and a chamber containing a fluid wherein said movable blades are at least partly immersed in said fluid, and wherein the difference between the refractive index of each blade and the refractive index of said fluid is sufficiently small to prevent significant reflection and refraction at the surface of each blade.

In a particular embodiment, the difference between the refractive index of each blade and the refractive index of said fluid may be 0.15 or less.

In a second embodiment, the refractive index of said fluid and the refractive index of said blades may be substantially equal at the wavelength of said radiation.

In alternate embodiments, the blades may be formed from quartz, fused silica, or calcium fluoride. The fluid may be water.

In yet another embodiment, each blade may be provided with a light absorbing coating on its upstream or downstream surface.

In another embodiment, the light absorbing coating may vary in a gradual way, so that the degree of absorption increases with increasing distance from the center of the illumination slit. The degree of absorption at the end of each blade nearest to the center of the illumination slit may be 0%.

In variations on the above embodiments, each blade may be triangular when viewed in the direction of the optical axis. Likewise, each blade may have the shape of an elongate rectangle. Each blade may be arranged along an axis perpendicular to the longitudinal axis of the illumination slit. Each blade may be arranged along an axis which is slanted with respect to the direction perpendicular to the longitudinal axis of the illumination slit. The end of each blade nearest the center of the illumination slit may be substantially parallel with the longitudinal axis of the illumination slit.

In another embodiment, the uniformity correction module of the first aspect of the present invention may be provided with a transparent top cover located upstream of said blades, and a transparent bottom cover located downstream of said blades. An absorptive coating may be applied to the top or bottom cover at locations between adjacent blades, so as to prevent light leakage between the blades.

In a particular application, the liquid may be more absorptive than said blades. The uniformity correction module may be provided with a transparent top cover located upstream of said blades, and a transparent bottom cover located downstream of the blades, and wherein the distance between each blade and the top cover, and between each blade and the bottom cover, is about 0.05 mm to 0.1 mm. The blades may be transparent. The liquid may have an absorption coefficient of about 0.2/cm.

Likewise, the blades may be slanted at an angle relative to the direction perpendicular to the longitudinal axis of the illumination slit, and wherein the end of each blade nearest the center of the illumination slit is substantially parallel with the longitudinal axis of the illumination slit.

In yet another embodiment, the blades may be provided with complementary shaped protrusions and grooves along their sides, each protrusion fitting into a respective groove, so as to prevent radiation from passing through the uniformity correction module without also passing through the blades.

Furthermore, the edges of adjacent blades on the same side of the illumination slit may have a V-shaped profile, and wherein a V-shaped projection along the edge of each blade fits into a V-shaped groove along the edge of an adjacent blade, so as to prevent radiation from passing through the uniformity correction module without also passing through the blades.

In a particular embodiment, the thickness of each finger, from its upstream edge to its downstream edge, may be between about 1 mm and 2 mm. In another variation, the edges of each finger may be polished.

The uniformity correction module may further comprise a circulation arrangement for introducing liquid into the chamber and removing liquid from the chamber during use.

Each blade may be formed from an opaque member supported by a quartz substrate.

In another embodiment, the opaque member may be a metallic foil.

In another embodiment, the liquid may contain at least one additive which affects the level of absorption of light by the liquid.

In accordance with a further aspect of the present invention there is provided a lithographic apparatus including an illumination system for providing a projection beam of radiation, a support structure for supporting a patterning device, the patterning device serving to impart the projection beam with a pattern in its cross-section, a substrate table for holding a substrate, a projection system for projecting the patterned beam onto a target portion of the substrate, and a uniformity correction module including a plurality of movable blades arranged along each side of the projection beam, and a chamber containing a fluid, wherein the movable blades are at least partly immersed in the fluid, and wherein the difference between the refractive index of each blade and the refractive index of the fluid is sufficiently small to prevent significant reflection and refraction at the surface of each blade.

In such an apparatus, the uniformity correction module may be located just above the patterning device.

In accordance with a further aspect of the present invention, there is provided a method of increasing the uniformity of an illumination beam, the method including placing in the illumination beam a uniformity correction module including a plurality of movable blades arranged along each side of the illumination beam, and a chamber containing a fluid, wherein the movable blades are at least partly immersed in the fluid, and adjusting the positions of the blades of the uniformity correction module so as to increase the uniformity of the illumination beam.

In accordance with a still further aspect of the present invention, there is provided a device manufacturing method including providing a substrate, providing a projection beam of radiation using an illumination system, using a patterning device to impart the projection beam with a pattern in its cross-section, projecting the patterned beam of radiation onto a target portion of the substrate, placing in the projection beam a uniformity correction module including a plurality of movable blades arranged along each side of the projection beam, and a chamber containing a fluid, wherein the movable blades are at least partly immersed in the fluid, and adjusting the positions of the blades of the uniformity correction module so as to increase the uniformity of the projection beam.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respec-tively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
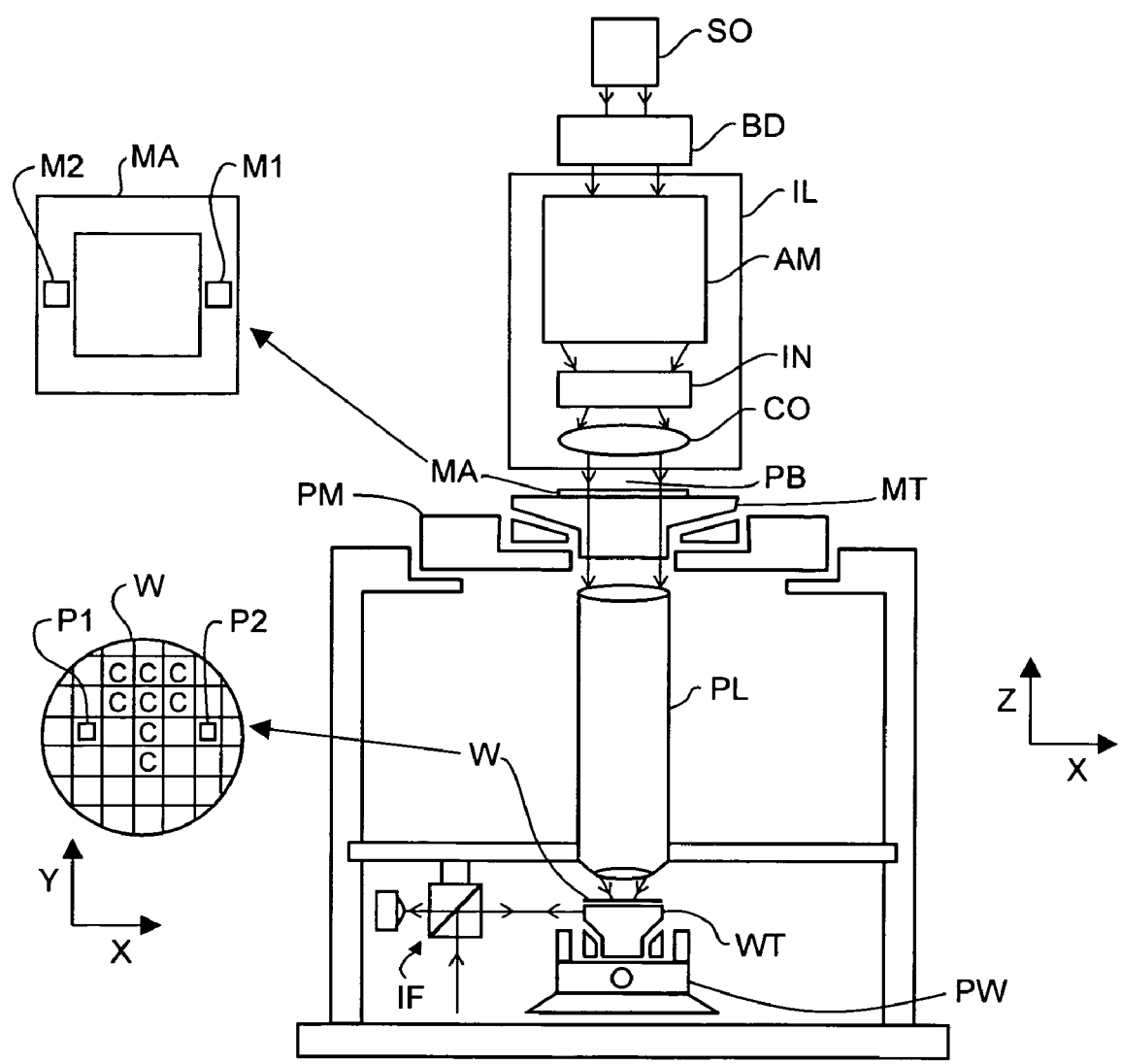
FIG. 1 depicts a lithographic apparatus.

FIG. 1 schematically depicts a lithographic apparatus according to a particular embodiment of the invention. The apparatus comprises:

an illumination system (illuminator) IL for providing a projection beam PB of radiation (e.g. UV radiation);

a first support structure (e.g. a mask table) MT for supporting a patterning device (e.g. a mask) MA and connected to first positioner PM for accurately positioning the patterning device with respect to item PL;

a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise adjustable optical element or elements AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

In FIG. 1 the radiation from the source SO travels "downwardly" or "downstream" towards the substrate/wafer W. In this specification references to "top" and "upper" and the like are to be understood as corresponding to "upstream" in the lithographic apparatus of FIG. 1, and references to "bottom" and "lower" and the like are to be considered as corresponding to "downstream". Thus "top and bottom" and "upper and lower" are defined only by the direction of the radiation in the device, and have no connection with the direction of gravity in relation to the device.

Figure 2:
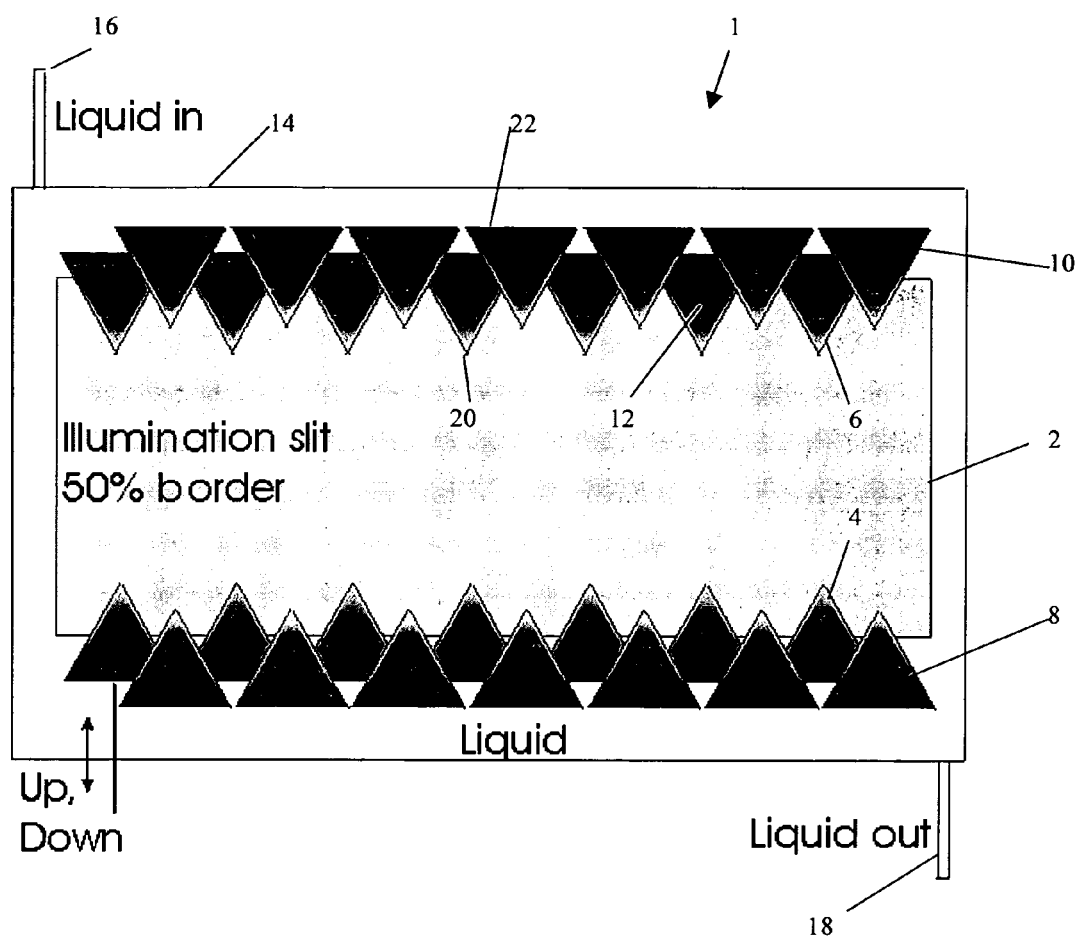
FIG. 2 shows an illumination slit provided with triangular blades according to a first embodiment of the invention.

FIG. 2 shows a uniformity correction module 1, in accordance with an embodiment of the invention, in which an illumination slit 2 is provided with two inner rows of triangular blades 4 and 6, and two outer rows of triangular blades 8 and 10. In this specification "illumination slit" refers to the slit-shaped area of illumination produced by a physical slit.

Although the blades are shown arranged in rows, it should be understood that each triangular blade can be moved independently of any other blade in the same row, or indeed in a different row. Any suitable mechanism can be used for moving the blades, and the mechanism is not shown in the drawings. The mechanism for manipulating the blades can allow all blades within a row to move together, or separately.

Also, the movement of a blade on one side of the slit can be linked to the movement of the corresponding blade on the other side of the slit 2, so that for example when the blade moves inwardly, its partner on the opposite side of the slit moves inwardly by the same amount. However, there is no requirement for the movement of the blades to be linked in this way, and as noted above the movement of each blade can be completely independent of the movement of any other blade, thus allowing total flexibility when using the uniformity correction module to smooth an intensity distribution. The blades may be moved together for adjusting a long wave distribution, and may be moved separately if a high frequency distribution needs to be corrected.

Each triangular blade is provided with a light-absorbing coating, eg chromium, on its upper surface 12. FIG. 2 is a view of the uniformity correction module 1 from the top, so the triangular surface (labelled 12) of each blade which is visible in FIG. 2 is considered as the upper surface of the blade. The degree of absorption varies across the triangle in a gradual (ie. "graded") way, and this is indicated in FIG. 2 by the variation in shading on each triangular blade. In this embodiment, the degree of absorption varies from 0% at the inner tip of each triangular blade to a maximum of between 5 and 10% at the base of each blade.

The graded coating can be fabricated using evaporation, where the coating is deposited on part of the blade using a mask, where the shadow causes the grading.

The blades 2, 4, 6, 8 are themselves formed from a radiation transparent material, for example quartz, and are immersed in a transparent liquid, which may be water. A chamber 14 contains the liquid, and surrounds the illumination slit 2 and the blades. Liquid flows into the chamber 14 through an inlet port 16, and leaves the chamber 14 through an outlet port 18.

The thickness of each blade, from the triangular top surface 12 to the triangular bottom surface, is between 0.5 and 3.5 mm. The distance from the tip 20 to the base 22 of each blade is between 2 and 8 mm. The width of each blade is between 2 and 15 mm. The smaller the blades, the more are needed to cover the length of the slit 2.

Because the blades 2, 4, 6, 8 are formed from thin graded coated quartz plates mounted in water, only the graded coating affects the light beam. Due to the small refractive index difference between quartz and water, the quartz substrates (ie plates) do not need an anti-reflective (AR) coating because there is no reflection at the quartz-water interface, while the edges of the substrates have no influence on the beam. This is because the coating is preferably applied only to the top or bottom surface of each quartz plate.

The preferred limit for the difference in refractive index between the blades and the liquid is a maximum of 0.15, which is slightly greater than the difference (of 0.126) between water (1.437) and quartz (1.563). Given the equation for reflectance $R=((n1-n2)/n1+n2))^2$ the difference between water and quartz gives a reflectance of less than 0.2%, while the difference of 0.15 results in a reflectance of 0.25%. Obviously using a smaller refractive index difference will decrease the reflection even further.

The liquid can be the same as the one used for immersion imaging either in series or parallel flow, but may be a different circuit and even a different liquid depending on what is preferable in view of having substantially equal refractive indices. Immersion imaging is a recent technique which uses a liquid, such as water, between the lens and the wafer.

Instead of, or in addition to, using an absorbing coating, one could use a thin absorbing foil (such as a metallic foil, or other opaque member) supported by a quartz substrate. One advantage of such an arrangement is that the shape of the absorbing structure can be easily made by cutting the foil.

The uniformity correction module 1 is intended to be used in the same manner and for the same purpose as the dynamic adjustable slit described in U.S. Pat. No. 6,097,474 mentioned above. The illumination field is continually adjusted and controlled, but "continually" may mean one adjustment of the blades per hour, or even less frequently.

In the lithographic apparatus of FIG. 1, the uniformity correction module 1 may be located just above the reticle, or at a different position in the illuminator which can be treated as an intermediate image.

The uniformity of the radiation intensity distribution can be measured with a sensor at wafer level. Based on this measurement the uniformity correction module is adjusted so that most of the intensity variations are removed.

If the exposure of a die starts, the wafer stage, the reticle stage and the internal REMA (reticle masking blades that determine the field size, being something completely different from the blades 2, 4, 6, 8 described above) start moving, while the laser starts exposing. The combination of these effects results in a non-uniform dose behaviour during the scan in the non-scanning direction. If this behaviour is known, one can correct for this by using the uniformity correction module.

Obviously one can also correct slit position dependent dose variations caused by large changes in reticle reflections caused by changing from dark field to bright field areas. Dark field areas are covered with chromium and thus reflect light back into the illuminator. This back-reflected light might also be back-reflected again towards the reticle to cause small dose differences between light and dark areas.

Figure 3:
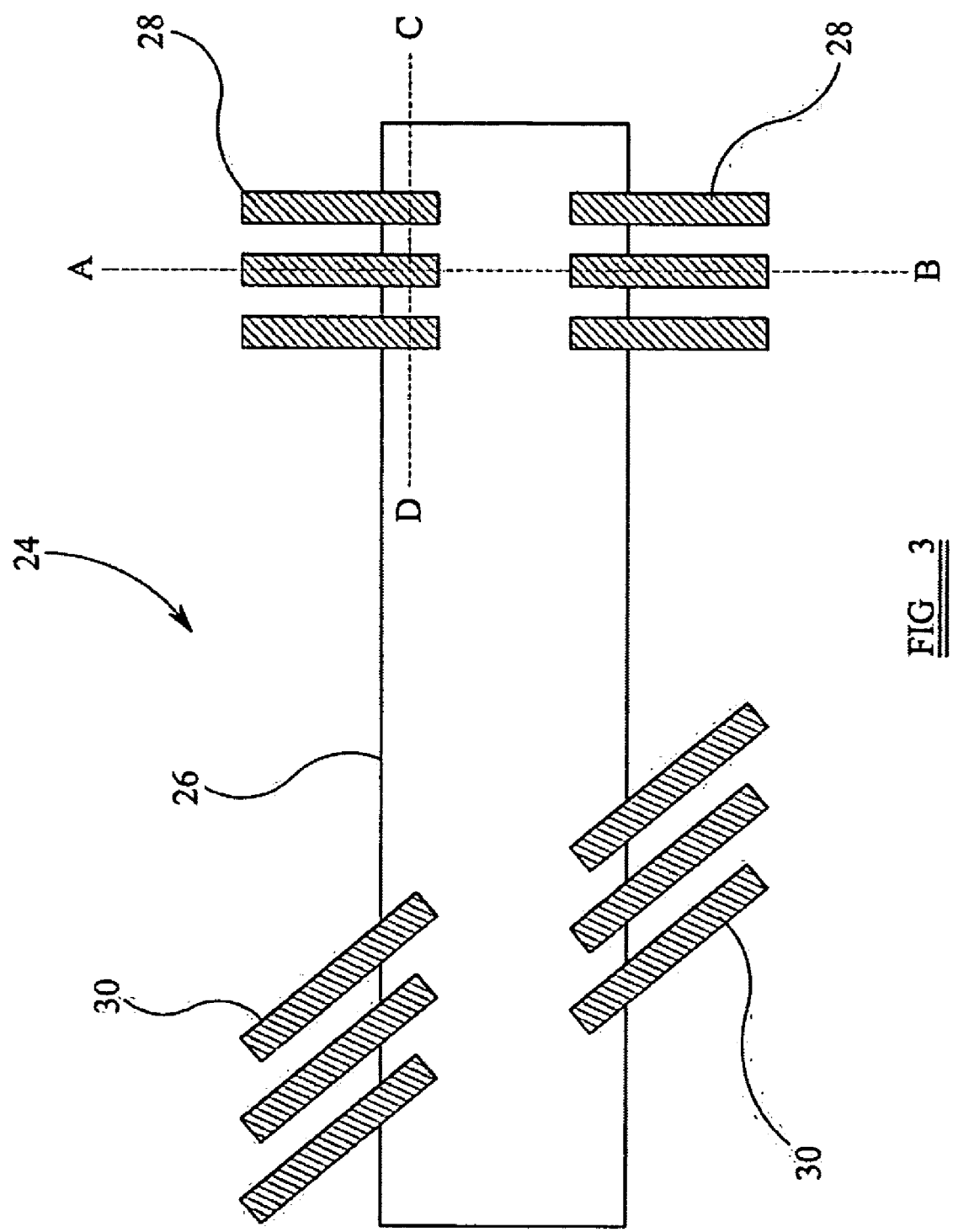
FIG. 3 is an overview of an illumination slit, showing two possible arrangements of finger-like blades, in accordance with a second embodiment of the invention.

FIG. 3 shows a uniformity correction module 24 in accordance with a further embodiment. This time the blades are in the form of rectangular fingers which are arranged to be moved into and out of the slit 26. The fingers may be arranged perpendicular to the slit 26 as indicated by fingers 28 at the right hand side of FIG. 3, or the fingers may be slanted at a different angle to the slit 26 as indicated by the fingers 30 at the left hand side of FIG. 3. Although FIG. 3 shows both the fingers 28 and the fingers 30 in the same drawing, these represent alternative configurations.

The other features of the uniformity correction module 24 of FIG. 3 are generally the same as those of FIG. 2. That is, the fingers 28, 30 are formed from quartz having a graded coating on the top surface thereof, and the fingers are immersed in a liquid, such as water. Again, the fingers may be manipulated individually, or together with other fingers.

The fingers 28, 30 may be completely absorbing or may have a graded coating with the absorption increasing from center to the edge of the slit. The graded coating may be such that the level of absorption increases linearly from the inner end of the finger (ie the end closest to the center of the slit) for a certain distance, and then becomes constant. The absorption profile would then resemble one end of a trapezium.

Figure 4:
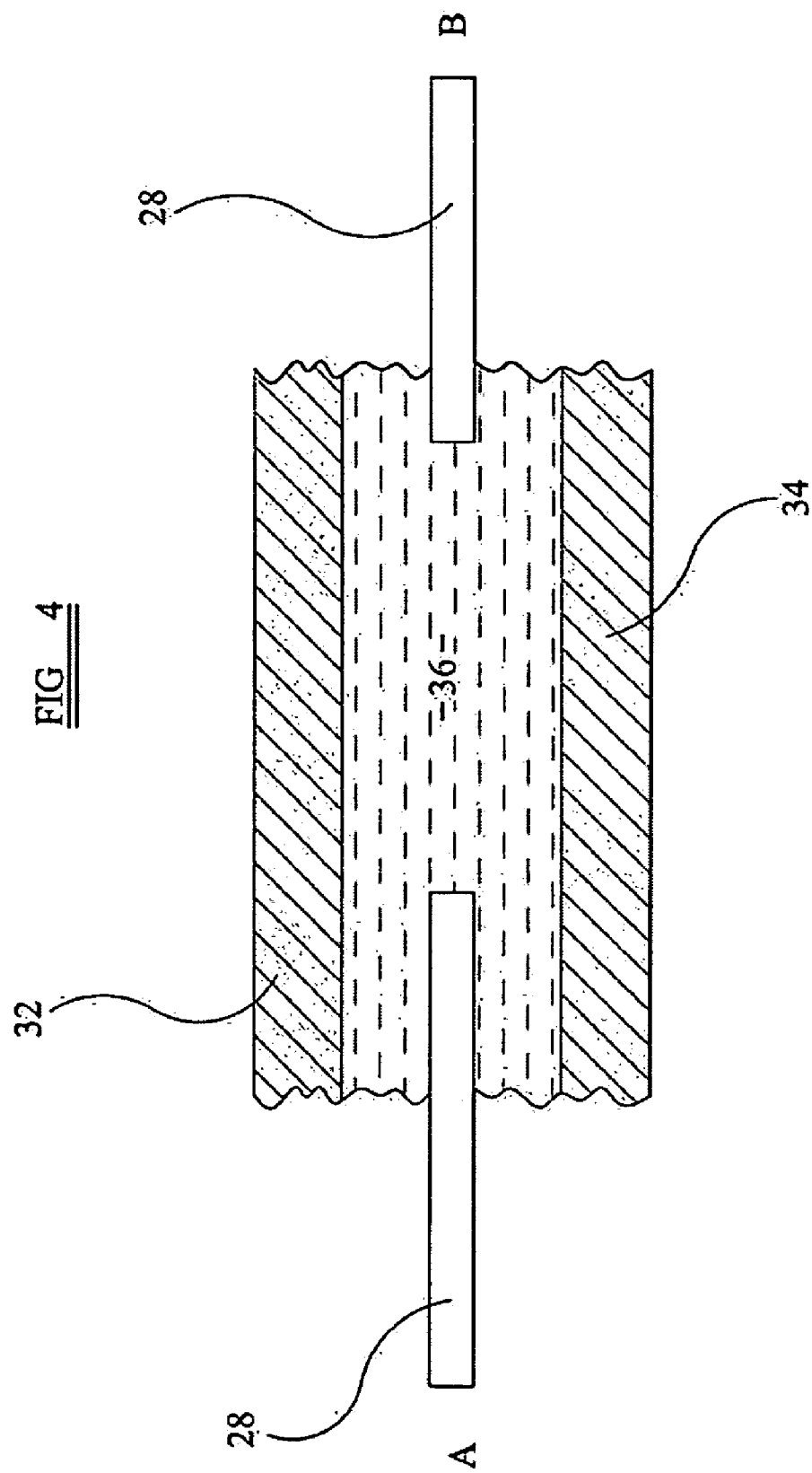
FIG. 4 is a cross-sectional view taken along A-B in FIG. 3.

FIG. 4 shows the cross-section along the line A-B in FIG. 3. It shows the top and bottom covers 32 and 34 respectively of the illumination slit 26. These covers are transparent and may be formed from quartz. Water 36 is contained between the covers 32 and 34, and the fingers 28 (or 30) can be moved in and out of the slit 26 as required. Motors for moving the fingers may be provided in the water or outside, depending on the chosen construction.

Figure 5:
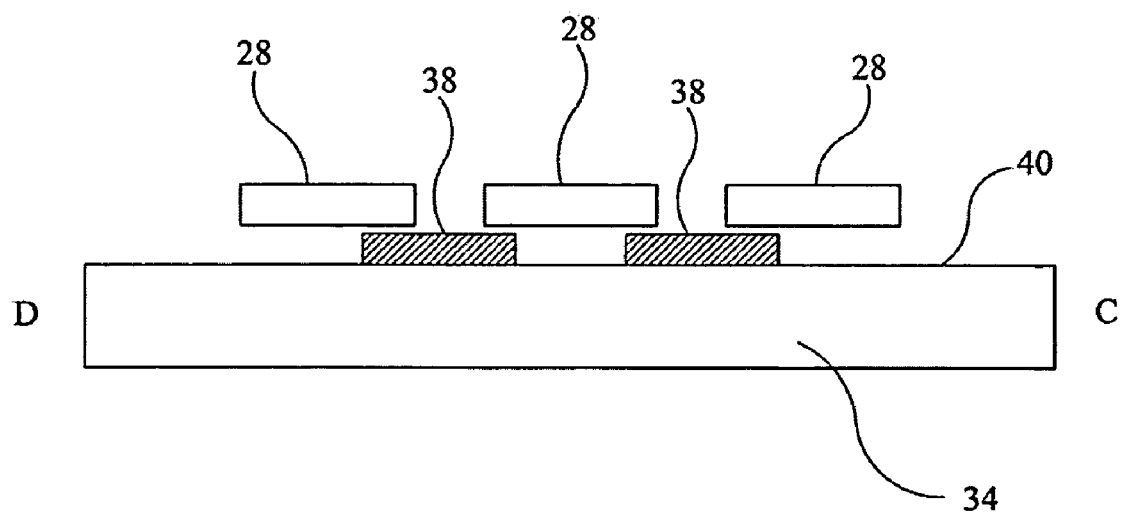
FIG. 5 is a cross-sectional view taken along C-D in FIG. 3.

FIG. 5 is a cross-sectional view taken along the line C-D in FIG. 3. It shows 3 of the fingers 28 positioned above the bottom cover 34. FIG. 5 shows an optional absorbing coating 38 deposited in lines on the top surface 40 of the bottom cover 34. The coating 38 is positioned in the open spaces between each pair of adjacent fingers 28, thus preventing light leakage caused by scattering of light at the edges of the fingers 28. The coating 38 may have an absorption up to 100% (ie opaque). The coating could of course alternatively be placed on the top cover.

The illumination slits 2 and 26 shown in FIGS. 2 and 3 actually have a trapezium-shaped intensity profile. The slit size is determined by the positions on the slope were the intensity is 50% of the maximum intensity.

Figure 6:
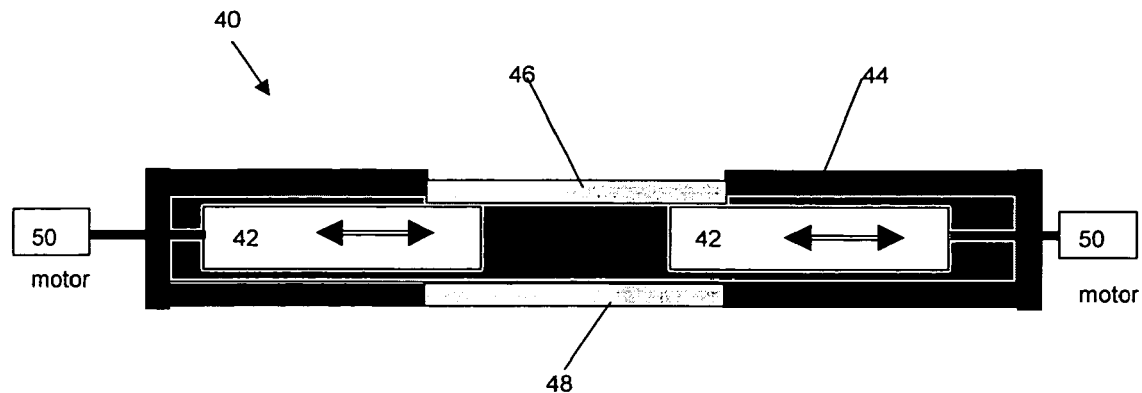
FIG. 6 is a cross-sectional view through a third embodiment of the invention.
Figure 7:
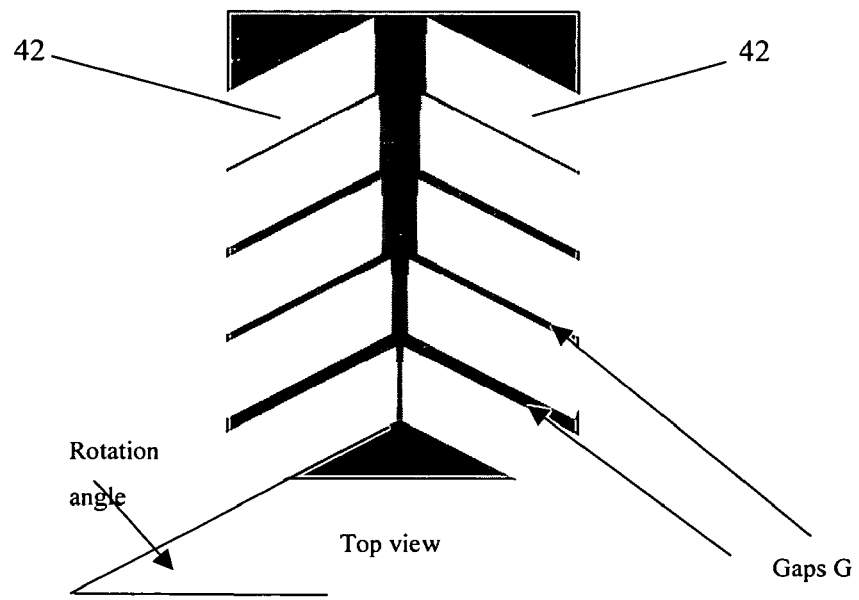
FIG. 7 is a top view of the third embodiment.
Figure 8:
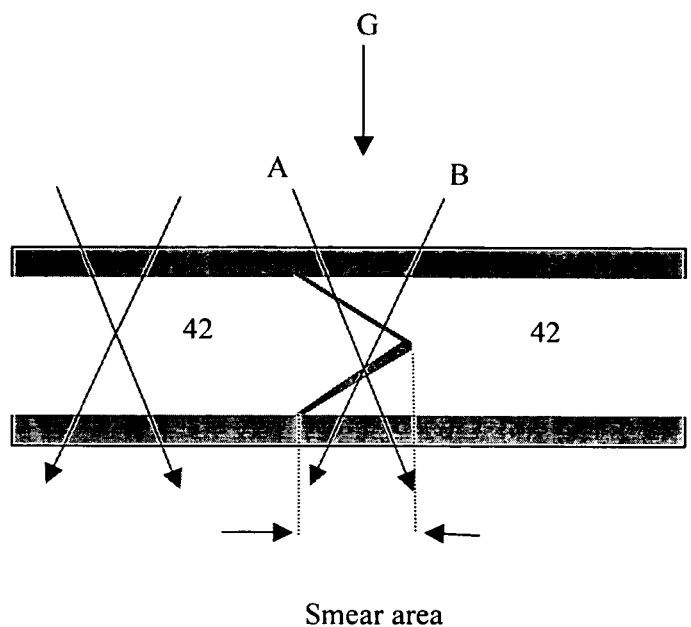
FIG. 8 is a cross-sectional view through two adjacent fingers on the same side of the illumination slit, showing the edges of the fingers provided with V-shaped profiles which allow the fingers to fit together.

We now turn to the embodiment of FIGS. 6, 7 and 8, which also relates to a uniformity correction module using blades immersed in liquid, but in this case the liquid is more absorptive than the blades.

It is known to use a set of "fingers" or blades with a predetermined optical transmission placed from the sides of an illumination slit in the optical path in order to correct uniformity. The device itself is located in a strongly defocused space which means that the correction does not only affect uniformity in the field but pupils as well.

This concept may cause the following problems which will be explained below:
 fingers have edges which produce shadows and/or bright stripes in the field
 gaps between fingers may cause light leaks—bright stripes
 fingers have to be very thin and may be difficult to make.

Infringing into the field from the sides causes significant ellipticity. If fingers are inserted deep enough in the field, the ellipticity does not suffer but losses of light become significant.

FIG. 6 shows a uniformity correction module (unicom) 40 which comprises a plurality of fingers 42 which are movably mounted within a chamber 44 containing a liquid. The fingers 42 are immersed in the liquid. The chamber 44 has upper and lower transparent portions 46 and 48 which allow light to pass through the illumination slit. Motors 50 are provided for moving the fingers 42 individually or together with other fingers, as discussed above.

In this embodiment, the fingers 42 have a thickness, from top to bottom, of 1.4 mm, and the spacing between the top each finger 42 and the upper wall of the chamber 44 is 0.05 to 0.18 mm. Likewise, the spacing between the bottom of each finger 42 and the lower wall of the chamber 44 is 0.05 to 0.18 mm. The width of the upper and lower transparent portions 46 and 48 (in the scan direction, which is also the direction of movement of the fingers 42) is 62 mm.

The uniformity correction module (unicom) 40 uses a liquid which absorbs some of the light at the working wavelength, such as 193 nm.

The liquid can be water with some absorbing additive, and the fingers 42 and the upper and lower transparent portions 46 and 48 can be made out of fused silica.

Several goals are achieved in the proposed design: Attenuation occurs in the middle of the field, which has no effect on ellipticity. When no adjustment is required, the fingers can be placed all way to the middle of the field and attenuation is minimal. No edge effects, like shadows or bright stripes are created. Gaps between fingers still can cause problems which can be resolved by cutting the edges of the fingers at an angle, as will be explained below. This becomes possible because fingers are thicker than in the previous embodiments.

The whole construction is immersed into absorptive water which has an additive with certain coefficient of absorption at 193 nm. The whole unicom package is about 7 mm thick which is comparable with the current 6.25 mm compensation plate plus some allowances for the fingers 42.

A top view of the unicom 40 is shown in FIG. 7. FIG. 7 is a schematic diagram which shows that the ends of the fingers 42 are actually parallel with the longitudinal axis of the slit, so that opposite pairs of fingers 42 come together with no gap between them.

The adjustment works in the following way. When both sets of the fingers 42 are inserted all the way and touch each other in the middle of the illumination slit there is low attenuation. As the fingers 42 move apart, absorption grows in the middle of the field, which is the most desirable form of attenuation.

Reflection from the fingers 42, and the edges of the fingers, will be negligible. The difference between the refractive indices of water and fused silica give rise to 0.1% reflection and between water and CaF2 (fluorite), 0.01% reflection.

As will be explained below with respect to FIG. 9, all edges of the fingers 42 are polished and shadows therefore do not exist. Bevels will be made and they will be shined also, and therefore scatter from edge chips will not exist.

Figure 9:
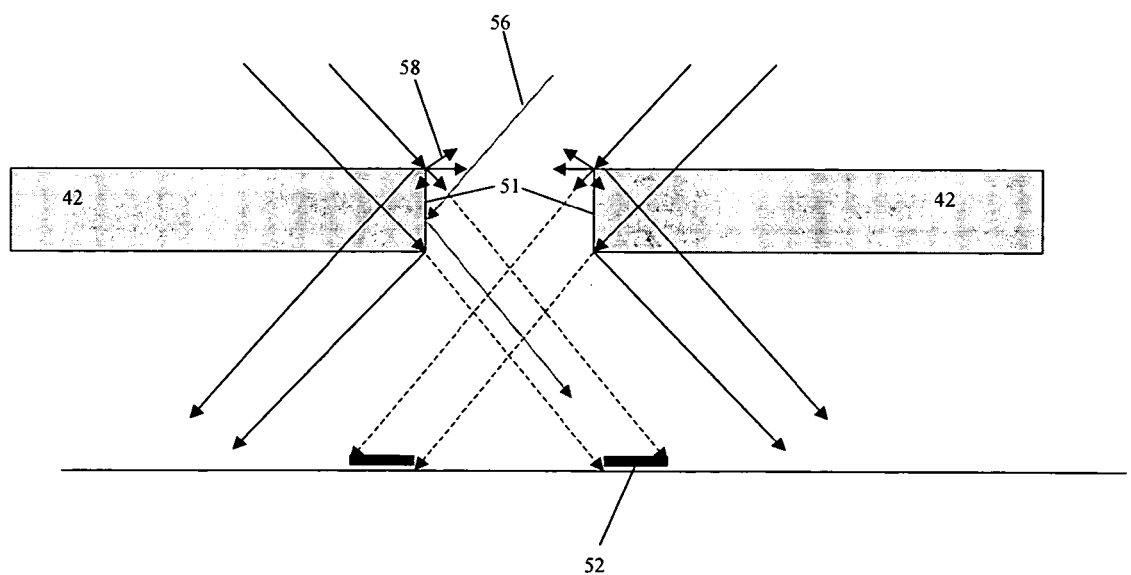
FIG. 9 illustrates the passage of light between the ends of a pair of fingers on opposite sides of the illumination slit.

FIG. 9 shows how light can be reflected from the ends 51 of a pair of fingers 42 if no liquid is used to surround the fingers 42. The fingers 42 are thick (1 to 2 mm) and create significant shadows 52 at the reticle plane 54. Light that hits the edge 51 of a finger 42 from the inside of the finger 42 reflects 100% because of total internal reflection and this causes a part of the field (ie shadows 52 shown in the drawing as bold black lines) not to be illuminated. Although the light striking the edge of the fingers 42 from outside (illustrated by arrow 56) will complement the lost light, it can be shown that it does not do so exactly and it does not complement the lost light at all at the edges of the field. If the edge of each finger 42 is ground instead of polished, light does not reflect specularly from outside at all and this causes shadows everywhere.

This is why prior art arrangements have been forced to use thin fingers (0.2 mm). Shadows caused by thin fingers are significantly reduced but still they present a serious problem and do not allow adjustment of the field uniformity to achieve good flatness of light intensity. Ripples from the shadows still remain. Another problem with thin fingers is that it is impossible to process the edge appropriately, and chips remain which create stray light (shown in FIG. 9 by arrows 58). From a manufacturing point of view, it is preferable to work with thick fingers but they have the set of problems described above.

In the proposed configuration of FIGS. 6 to 8, the fingers 42 are thick (1 to 2 mm), and the edges are polished (shined). Because the fingers 42 are immersed in a liquid with a matching refractive index, there is no internal total reflection and no shadows. There is also no reflection from outside the edges. Stray light is not a problem also because there are no sharp edges and chips.

Extra absorption between the fingers 42 on the same side of the illumination slit also represents a serious problem, as will be explained below. This problem is avoided by shaping the sides of the fingers 42 as shown in FIG. 8. The (long) sides of the fingers 42 are angled or tapered, or formed in a V-shape, as shown in FIG. 8.

In the prior art (where fingers were surrounded by air, rather than a liquid) the fingers are partially absorptive and gaps (0.1 mm wide) between fingers on the same side of the illumination slit are transmissive. The contrast 100% (gap)–85% (finger) is enough to create noticeable ripples in the uniformity. In the case of Y dipole illumination, for example, almost all light will leak through this gap.

The reason for this is that the illuminator can create an illumination pattern such that all points at the reticle (and also at the wafer) are illuminated by two narrow beams converging to this point. In the case of Y dipole illumination these two beams are positioned along the scan direction, ie along a line which is perpendicular to the longitudinal axis of the illumination slit, and if the fingers are also perpendicular to the longitudinal axis of the illumination slit then light leaking through the gaps between adjacent fingers is significant.

Rotating the fingers at an angle to the scan direction reduces the problem significantly but it still exists. If fingers were not rotated, the prior art design would not have been usable at all.

In the proposed configuration shown in FIGS. 6 to 8 we have similar problems. The finger area is not 100% transmissive because there is some absorptive liquid above and below the fingers 42, and this is unavoidable. The depth of absorptive liquid above (and below) the fingers is typically 0.05 mm to 0.1 mm. This depth can be made very small if a viscosity reducing component is added to the liquid.

If the area of the fingers is 98.2% transmissive (absorption coefficient of liquid assumed to be 0.2/cm.), the narrow gaps (labelled G in FIG. 7) between the fingers would be 83% transmissive and we would have approximately the same finger/gap contrast as in the prior art but in reverse: ie more transmissive fingers and less transmissive gaps. This will create ripples as in the prior art. To solve this problem the fingers 42 are rotated so that they are not perpendicular to the illumination slit as shown in FIG. 7, as is done in the prior art, and because the fingers 42 are thick the sides of the fingers are made V-shaped as shown in FIG. 8 (something which is impossible to do for thin 0.2 mm fingers).

The fingers 42 in FIG. 7 are shown in an exemplary arrangement in which they are creating a certain attenuation pattern. The fingers at the top of the figure are spaced further apart, so at the top there is more attenuation than at the bottom. This means that uniformity curve showed a bump at the top which is being compensated for using the device.

FIG. 8 shows how the effect of the gaps G between the fingers 42 are significantly reduced by giving the sides of the fingers 42 complementary V-shaped profiles so that they fit together as shown in FIG. 8. The key is that angle of the V-groove must be shallow enough to ensure that rays with extreme angles, present in the illumination light (illustrated by rays A and B in the FIG. 8), will cross it instead of traveling along it. If rays travelled along the gap they would suffer too much aborption. Provided the rays cross the gap, the gap will represent minimum absorption and the intensity distribution will be smeared over a certain "smear area" along the edge of the fingers 42 as illustrated in FIG. 8.

The embodiment of FIGS. 6 to 8 may further include a water circulation system, which allows a change to be made to the level of absorption of the water, and thus allows a change to the effective finger transmission. The liquid may contain one or more additives which affect the degree of absorption of light, and as the liquid is circulated the amount or type of additive may be changed in order to change the level of absorption. The liquid circulation circuit also allows for the recycling and "refreshment" of the used liquid.

Combinations and/or variations on the above described modes of use or entirely different modes of use may also be employed.

All embodiments of the invention are also suitable for use in CCD applications. A CCD is a Charge Coupled Device. The application area of CCD production needs an extremely good uniformity of the intensity of the beam, and the uniformity value should be better (ie. lower) than 0.02%. Uniformity=(Imax−Imin)/(Imax+Imin)*100%. 'Uniformity' usually refers to the 'scanning uniformity' or 'scanning dose uniformity'. In any embodiment of the invention, the blades may be either partly or fully immersed in the liquid which is being used.

Although we have referred to liquids in the specification, a pressurised gas could also be used. The refractive index of a gas increases with increasing pressure, and the pressure could be increased so that the refractive index is similar to that of the blades. Therefore the invention can be used with fluids, which can be either liquids or pressurised gases.

While specific embodiments of the invention have been described above, it will be appreciated that the invention may be practiced otherwise than as described. The description is not intended to limit the invention.

We claim:

1. A uniformity correction module to improve the uniformity of a radiation distribution in a rectangular illumination slit having two longer sides and two shorter sides, comprising:
   a plurality of movable blades arranged along each longer side of the illumination slit; and
   a chamber configured to contain a fluid;
   wherein, in use of the uniformity correction module, said movable blades are at least partly immersed in said fluid, and the difference between a refractive index of each blade and a refractive index of said fluid is sufficiently small to prevent significant reflection and refraction at a surface of each blade.

2. A uniformity correction module as recited in claim 1, wherein a difference between the refractive index of each blade and the refractive index of said fluid is 0.15 or less.

3. A uniformity correction module as recited in claim 1, wherein the refractive index of said fluid and the refractive index of said blades are substantially equal at a wavelength of said radiation.

4. A uniformity correction module as recited in claim 1, wherein said blades comprise quartz, fused silica, or calcium fluoride.

5. A uniformity correction module as recited in claim 1, wherein said fluid is water.

6. A uniformity correction module as recited in claim 1, wherein each blade further comprises a radiation absorbing coating on at least one surface.

7. A uniformity correction module as recited in claim 6, wherein said radiation absorbing coating varies in a gradual way, so that a degree of absorption increases with increasing distance from a center of the illumination slit.

8. A uniformity correction module as recited in claim 6, wherein a degree of absorption at the end of each blade nearest to a center of the illumination slit is 0%.

9. A uniformity correction module as recited in claim 1, wherein each blade is triangular when viewed in a direction of an optical axis of the module.

10. A uniformity correction module as recited in claim 1, wherein each blade has the shape of an elongate rectangle.

11. A uniformity correction module as recited in claim 10, wherein each blade is arranged along an axis perpendicular to a longitudinal axis of the illumination slit.

12. A uniformity correction module as recited in claim 10, wherein each blade is arranged along an axis that is slanted with respect to a direction perpendicular to a longitudinal axis of the illumination slit.

13. A uniformity correction module as recited in claim 12, wherein an end of each blade nearest the center of the illumination slit is substantially parallel with a longitudinal axis of the illumination slit.

14. A uniformity correction module as recited in claim 1, further comprising a transparent top cover located upstream of said blades, and a transparent bottom cover located downstream of said blades.

15. A uniformity correction module as recited in claim 14, wherein an absorptive coating is applied to the top or bottom cover at locations between adjacent blades, so as to reduce radiation leakage between the blades.

16. A uniformity correction module as recited in claim 1, wherein said liquid is more absorptive than said blades.

17. A uniformity correction module as recited in claim 16, which is provided with a transparent top cover located upstream of said blades, and a transparent bottom cover located downstream of said blades, and wherein a distance between each blade and the top cover, and between each blade and the bottom cover, is between about 0.05 mm and about 0.1 mm.

18. A uniformity correction module as recited in claim 16, wherein said blades are transparent.

19. A uniformity correction module as recited in claim 16, wherein said liquid has an absorption coefficient of about 0.2/cm.

20. A uniformity correction module as recited in claim 16, wherein the blades are slanted at an angle relative to a direction perpendicular to a longitudinal axis of the illumination slit, and wherein an end of each blade nearest a center of the illumination slit is substantially parallel to the longitudinal axis of the illumination slit.

21. A uniformity correction module as recited in claim 16, wherein the blades are provided with complementary shaped protrusions and grooves along their sides, each protrusion fitting into a respective groove, so as to prevent radiation from passing through the uniformity correction module without also passing through the blades.

22. A uniformity correction module as recited in claim 16, wherein edges of adjacent blades on a same side of the illumination slit have a V-shaped profile, and wherein a V-shaped projection along the edge of each blade fits into a V-shaped groove along the edge of an adjacent blade, so as to prevent radiation from passing through the uniformity correction module without also passing through the blades.

23. A uniformity correction module as recited in claim 16, wherein a thickness of each blade, from its upstream edge to its downstream edge, is between about 1 mm and about 2 mm.

24. A uniformity correction module as recited in claim 16, wherein edges of each blade are polished.

25. A uniformity correction module as recited in claim 1, which further comprises a circulation system configured to introduce liquid into said chamber and remove liquid from said chamber during use.

26. A uniformity correction module as recited in claim 1, wherein each blade comprises an opaque member supported by a quartz substrate.

27. A uniformity correction module as recited in claim 26, wherein said opaque member comprises a metallic foil.

28. A uniformity correction module as recited in claim 1, wherein said liquid contains at least one additive which affects a level of absorption of radiation by the liquid.

29. A lithographic apparatus comprising:
an illumination system configured to condition beam of radiation;
a support structure configured to support a patterning device, the patterning device configured to impart the beam with a pattern in its cross-section;
a substrate table configured to hold a substrate;
a projection system configured to project the patterned beam onto a target portion of the substrate; and
a uniformity correction module including:
a plurality of movable blades arranged along each side of the beam; and
a chamber configured to contain a fluid;
wherein, in use of the uniformity correction module, said movable blades are at least partly immersed in said fluid, and the difference between a refractive index of each blade and a refractive index of said fluid is sufficiently small to prevent significant reflection and refraction at a surface of each blade.

30. A lithographic apparatus as recited in claim 29, wherein said uniformity correction module is located before said patterning device in the path of the beam.

31. A method of increasing uniformity of an illumination beam of radiation comprising:
producing the illumination beam; and
positioning a plurality of moveable blades at least partially immersed in a liquid or pressurized gas along each side of the illumination beam such that the blades block at least a portion of the radiation of the illumination beam thereby increasing a uniformity of the illumination beam.

32. A device manufacturing method comprising:
supplying a beam of a radiation;
patterning the beam of radiation with a pattern in its cross-section;
projecting the beam of radiation as patterned onto a target portion of a substrate;
positioning a plurality of moveable blades at least partially immersed in a liquid or pressurized gas along each side of the beam such that the blades block at least a portion of the radiation of the beam thereby increasing a uniformity of the beam.

* * * * *